United States Patent [19]

Ramspacher, Jr.

[11] 4,366,198
[45] Dec. 28, 1982

[54] SHEET MATERIAL SEPARATION CONSTRUCTION

[75] Inventor: Robert J. Ramspacher, Jr., Indianapolis, Ind.

[73] Assignee: RCA Corporation, New York, N.Y.

[21] Appl. No.: 246,937

[22] Filed: Mar. 24, 1981

[51] Int. Cl.³ .............................................. B32B 3/10
[52] U.S. Cl. ..................................... 428/43; 428/134; 428/135; 428/136; 428/901; 428/251; 428/415; 174/68.5; 339/17 R
[58] Field of Search ................. 428/43, 131, 134, 135, 428/136, 571, 596, 901, 415, 251; 248/DIG. 9; 29/413; 206/620, 611, 824; 174/68.5; 339/17 R

[56] References Cited

U.S. PATENT DOCUMENTS

| 3,324,212 | 6/1967 | Paulley et al. | 264/63 |
| 3,706,626 | 12/1972 | Smith et al. | 428/43 X |
| 3,780,431 | 12/1973 | Feeney | 29/626 |
| 4,216,523 | 8/1980 | Harford | 361/393 |

Primary Examiner—George F. Lesmes
Assistant Examiner—Alexander S. Thomas
Attorney, Agent, or Firm—Samuel Cohen; William Squire

[57] ABSTRACT

A relatively brittle sheet material, for example, a printed circuit board substrate, is subdivided into sections the boundaries of which are defined by apertures which permit the substrate to be fractured at the boundaries. Each aperture has side walls which intersect at points aligned along a separation line. Bending stresses are concentrated at the intersecting side walls to provide a clean straight fracture along the boundary.

10 Claims, 4 Drawing Figures

U.S. Patent
Dec. 28, 1982
4,366,198
Fig. 1
PRIOR ART
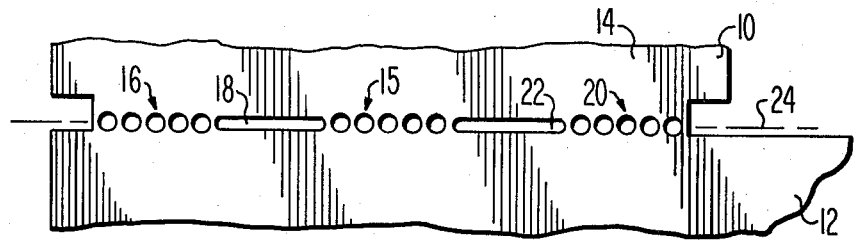
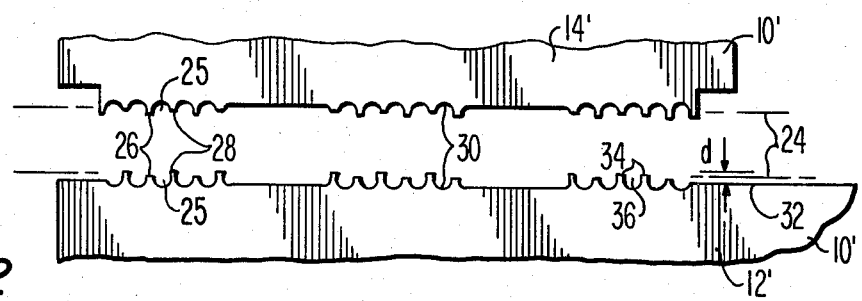
Fig. 2
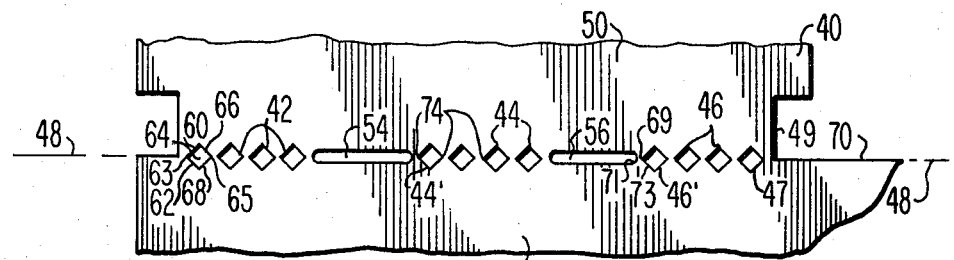
Fig. 3
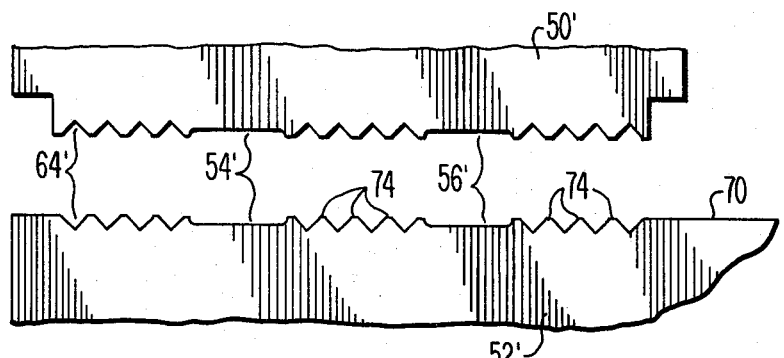
Fig. 4

SHEET MATERIAL SEPARATION CONSTRUCTION

The present invention relates to separation constructions for brittle sheet material.

It is common in the printed circuit art to manufacture, in a single process, from two to much larger numbers of circuits on a common substrate. The substrate may be made of a relatively brittle insulating material such as a phenolic material, or a thermosetting material such as epoxy sandwiched between two sheets of fiber glass. "Dink" lines, separation apertures, notches, or other means for weakening the substrate are generally formed in the substrate for permitting it to be divided into sections, each containing a circuit. The division is carried out after the conductors and other desired circuit elements are formed on the substrate, by printing or in other ways, by cracking the substrate at the weakened boundaries of the sections. An example of a substrate with a number of circuits thereon, and with apertures or notches which subdivide the substrate into sections is disclosed in U.S. Pat. No. 4,216,523 and in somewhat different format in U.S. Pat. No. 3,780,431. In U.S. Pat. No. 4,216,523 the means for weakening the boundaries are rectangular apertures or elongated grooves of rectangular cross-section. In U.S. Pat. No. 3,780,431 the apertures forming the boundaries are of generally circular shape.

The use of rectangular and circular apertures and grooves of rectangular cross-section for providing weakened boundaries in a substrate results in ragged edges along the cracks. Such ragged edges are uncontrolled in that the stresses at the weakened boundaries tend to fracture the relatively brittle substrate at somewhat undefined locations. These ragged edges in some instances are undesirable. For example, in television chassis it is desirable to utilize as little space as possible for the printed circuit board substrates. To allow for the ragged edges, the space which is made available for a printed circuit board must be increased as must the chassis with which the board abuts. Such abutting occurs where the edges of the printed circuit board abut against a plane sheet metal surface of the chassis. The ragged edges also tend to misalign the substrate with the chassis.

In accordance with one embodiment of the present invention, a sheet material separation construction comprises a plane sheet of insulating brittle material which fractures when subjected to bending stress, the sheet having a plurality of spaced aligned apertures, each aperture being formed of at least two side walls, the side walls intersecting at an angle less than 180° at at least one point. The points of intersection are aligned along a given line at which the board is to be separated such that bending stresses are concentrated at the points of intersection and the board separates substantially at the given line.

In the drawing:

FIG. 1 is a plan view of a prior art construction employing circuit and slit type apertures providing a weakened boundary between two sections of a sheet material to be separated;

FIG. 2 is a plan view of the weakened boundary areas of FIG. 1 after separation of two sections;

FIG. 3 is a plan view of a sheet material embodying the present invention; and

FIG. 4 is a plan view of the sections of sheet material of FIG. 3 after separation at the weakened boundary.

In FIG. 1 sheet material 10 is a relatively brittle composition such as a phenolic or thermosetting material sandwiched between two fiber glass layers as manufactured for the printed circuit art. These materials are relatively brittle and when subject to bending stresses tend to fracture. While the sheet 10 may be employed as printed circuit boards, they may also be incorporated in other structures as well.

When the sheets 10 are employed as printed circuit boards, copper conductors (not shown) are printed, etched, or otherwise formed on a surface of the separate sections such as 12 and 14 of the sheet 10. The sections 12 and 14 are bounded by a plurality of groups 15, 16, and 20 of aligned holes formed through the sheet material. The groups 15, 16, and 20, each containing five circular holes, with adjacent groups separated by an elongated slot. For example, the holes of group 15 are separated from the holes of group 20 by slot 22 and the holes of group 15 from group 16 by slot 18. The holes of groups 15, 16, and 20 are usually formed by punching or drilling. The holes and slots are aligned along an axis 24. After manufacture of the printed circuit boards with the conductive layers (not shown) formed thereon, the sections 14 and 12 are separated by applying bending stress at the axis 24. This tends to fracture the sheet 10 at the axis 24 due to the weakening of the sheet by the holes and slots.

In FIG. 2 the sections 14 and 12, after fracturing, are respectively shown at 14' and 12'. As a result of the fracturing of the sheet material 10', the side walls of the holes, such as hole 24 tend to fracture at irregular points. One side wall 26 of hole 24 fractures at a different spaced distance from axis 24 than side wall 28. Different holes tend to have their side walls fracture at different spaced distances from axis 24. Hole 30 has its side walls fractured differently than those of hole 34. The result is an undesirable ragged edge. The side walls of some of the holes such as hole 30 extend above an edge 32 of section 12' a distance d greater than axis 24 from edge 32. When the edge 32 is abutted against a flat surface such as an edge of a chassis, the edges of the broken side walls at 34, for example, of hole 36 tend to abut against such a flat surface and tilt or cock the sheet 10 so that the edge 32 is not parallel to the surface against which it is abutted.

This is a particular problem in certain chassis in which potentiometers, shafts, and other mechanical devices are attached to the edge of the printed circuit board at section 12' as the cocking and/or tilting of the board misaligns the potentiometers with the chassis and, which may cause, on occasion, mechanical interference or at least esthetically unpleasing misalignments. In a chassis in which the sheet section 12' is formed to exactly fit to a required dimension, the variations of the side walls of the various apertures 24, 30, 36, and so forth tend to use up allowable tolerances. If the "worst case" board must be allowed for the chassis must be made larger than would otherwise be needed. In the alternative, if the ragged edges of the various broken aperture walls have to be removed before insertion of the board in the chassis, this is costly and inefficient.

To alleviate the problems discussed above, sheet 40 of FIG. 3 is provided with aperture groups 42, 44, and 46 which are different than the usual circular apertures as shown in FIG. 1 and the square apertures such as may be employed in U.S. Pat. No. 4,216,523. In the present invention, the apertures of groups 42, 44, 46 are each of a shape such that the aperture walls intersect at the fracture axis 48 between sections 50 and 52, at an angle less than 180°. In the example illustrated the apertures of diamond (equilateral quadrilateral) shape and the angles intersected by axis 48 are 90°, each. The diamonds, in other words, are squares rotated 45° in this specific example. However, the angles can be of values other than 90°, and the apertures can be of a shape other than diamond provided that the angles made by the edges of the apertures are intersected at their origin by the fracture axis 48. The aperture groups 42, 44, and 46 are preferably identical. They may be formed by punching with a punch and die or in other ways. The number of apertures in a given group such as the group 42 may be any value but is shown here as four. Groups 42, 44, 46 are separated from one another by elongated slots. Slot 54 separates group 42 from group 44 and slot 56 separates group 44 from group 46. The spacing of the apertures is important and may be determined empirically in accordance with the board or sheet material 40 composition, thickness, and brittleness. That is, the spacing of the apertures can have an affect on the position of the stress line established by the intersecting side walls. The stress line should remain as close to axis 48 as desired for a given implementation. The further apart the apertures, the further the deviation of the stress line from axis 48. In one example where the apertures were oriented as diamonds with respect to axis 48 and were squares 0.062 inches on a side, the center-to-center spacing of the apertures was 0.138 inches along axis 48. The spacing of the center of aperture 47 from wall 49, FIG. 3, was 0.094 inches, all with nominal tolerances of ±0.005 inches. However, the above is given by way of example, as other spacing relationships would achieve the desired result, depending on material, composition, thickness and other related factors as discussed. What is also important is that the intersecting aperture side walls such as walls 60 and 62 of aperture 64 intersect at a point 63 lying on the axis 48. The remaining walls 66 and 68 of aperture 64 intersect at a point 65 on the same axis 48. Those intersecting points lie on the diagonal of the square formed by the aperture 64 side walls. In a similar manner, the side walls of the remaining apertures of groups 42, 44, 46 all intersect at points lying on the axis 48. The ends of the slots 54, 56 may be circular and need not be formed of intersecting side walls in the manner discussed with respect to aperture 64. The effect of one rounded side wall 71 on the location of the fracture point is not detrimental when the adjacent aperture such as 46' does have a sharp intersection of its side walls on axis 48 and those side walls form the outer wall 73 of the bridge member 69 between sections 50 and 52.

The axis 48 lies on edge 70 of section 52. It is to be understood that the section 52 is a relatively large sheet only a portion of which is illustrated in FIG. 3. Edge 70 therefore is relatively large extending off the drawing sheet to the right. The intersecting points for the side walls of the different square shaped apertures therefore lie along a line on edge 70.

The sharp intersection of the side walls preferably at 90° provides stress concentration at these points. This is to be compared to the prior art structure in which round holes such as shown in FIG. 1, or square holes whose side walls are normal to the fracture axis such as shown in U.S. Pat. No. 4,216,523 result in ragged fracturing of the sheet material between the weakening holes. The concentration of the bending stresses by the relatively sharp intersecting side walls of the different aperture groups 42, 44, 46 tend to cause the fracture stress line to lie along the axis 48. This tends to avoid the raggedness and uneven breakage locations of the prior art structures such as shown in FIG. 2.

While the apertures of groups 42, 44, and 46, FIG. 3, have been illustrated as of diamond shape with 90° angles, it would occur to those of ordinary skill that the apertures may alternatively be of diamond shape with either acute or obtuse angles at the fracture line, or may even be rectangular shape, with diagonally opposite corners of the rectangle being intersected by the fracture line. As another alternative, the apertures may be six sided, or of slot shape, in both cases with two edges of each aperture parallel to the fracture axis, and with each end of an aperture defined by two edges meeting at an angle, such as 90°, the fracture axis passing through the origins of these angles. In other words, in each case the bridging member between two adjacent apertures will be defined by two angles the origins of which lie on the fracture axis rather than by two continuous curves as occurs when two adjacent apertures are of circular shape as in FIGS. 1 and 2. The particular angle of intersection of the side walls of the aperture is not critical as long as the side walls intersect to provide the desired stress concentration.

As a further enhancement in providing a continuous edge surface with edge 70, FIG. 4, the apertures of groups 42, 44, and 46 have their centers on axis 48 which is coincident with edge 70. When the sections 50 and 52 are separated, the stress concentration causes the stress line to be almost flush with the edge 70. This tends to reduce the distance d of FIG. 2 to a negligible amount. As a result, tilting of the edge 70 when abutted against a flat surface is minimized, and provides a more accurate control than otherwise possible of the orientation of the section 52' with a mating chassis.

By clean break is meant that the bridging members between the apertures tend to fracture approximately at a given fracture line or axis rather than at unpredictable uneven locations as shown in FIG. 2.

The number of slots 54 and 56 that may be employed in a given implementation depends on the particular sheet material characteristics including its brittleness, thickness, and the relative width of sheet material to be broken. The number of apertures between the slots or whether or not slots are used also depends upon brittleness and material thickness in accordance with a given implementation. Generally, the weaker the material, the fewer the slots. The apertures in one implementation were squares 0.062 inches on a side, the slots 54, 56 were 0.062 inches wide and 0.817 inches long. Three sets of apertures in groups of four were employed. As a typical dimension, the center of aperture 44' was spaced from the center of aperture 46' 1.419 inches. The aperture 47 center was spaced from wall 71 0.508 inches. The sheet material was an epoxy woven glass and paper base composite having a thickness of 0.062 inches.

What is claimed is:
1. A sheet material separation construction comprising:
   a plane sheet of printed circuit board which fractures when subjected to bending stress, said sheet having a plurality of spaced aligned apertures, each aperture being formed of at least two side walls, said side walls intersecting at an angle less than 180° at at least one point, the points of intersection being aligned along a given line at which said board is to be separated, said given line being non-coincident with any of said side walls whereby bending stresses are concentrated at said points of intersection and said board separates substantially at said given line.

2. The sheet material as set forth in claim 1 wherein said apertures are squares, one diagonal of each square being aligned along said given line.

3. The sheet material as set forth in claim 1 wherein said apertures are rectangles.

4. The sheet material of claim 1 wherein said two side walls intersect at about 90°.

5. The sheet material as set forth in claim 1 wherein said apertures are equally spaced.

6. The sheet material as set forth in claim 1 wherein said apertures comprise at least two groups of apertures separated by a slot.

7. The sheet material as set forth in claim 1 wherein the sheet material comprises a thermosetting material.

8. A board including means for separating the board into at least two sections, comprising:
 a sheet of brittle electrically insulating printed circuit board material; and
 a plurality of separation apertures in said sheet spaced along a given axis, each aperture comprising at least a pair of intersecting side walls, the intersection of the side walls of all said apertures being aligned along said axis to form a fracture line at said axis said axis being non-coincident with any of said side walls.

9. The board of claim 8 wherein said apertures are diamond shaped with respect to the orientation of said axis.

10. A sheet material separation construction comprising:
 a plane sheet of printed circuit board, said sheet material comprising a sheet of epoxy sandwiched between two sheets of fiberglass, said sheet material fracturing when subjected to bending stress, said sheet material having a plurality of spaced aligned apertures, each aperture being formed of at least two side walls, said side walls intersecting at an angle less than 180° at at least one point, the points of intersection being aligned along a given line at which said board is to be separated, said given line being non-coincident with any of said side walls whereby bending stresses are concentrated at said points intersection and said board separates substantially at said given line.

* * * * *

UNITED STATES PATENT AND TRADEMARK OFFICE
CERTIFICATE OF CORRECTION

PATENT NO. : 4,366,198

DATED : December 28, 1982

INVENTOR(S) : Robert J. Ramspacher, Jr.

It is certified that error appears in the above-identified patent and that said Letters Patent is hereby corrected as shown below:

Column 6, line 11, claim 10, after "circuit board" but before the comma (,), insert --material--.

Signed and Sealed this

Twenty-second Day of March 1983

[SEAL]

Attest:

GERALD J. MOSSINGHOFF

Attesting Officer    Commissioner of Patents and Trademarks